United States Patent [19]

Kono et al.

[11] Patent Number: 4,492,986
[45] Date of Patent: Jan. 8, 1985

[54] VTR WITH HIGH-QUALITY AUDIO RECORDING SYSTEM

[75] Inventors: Takashi Kono, Hachiouji; Akira Minegishi, Tokyo; Toshimitsu Kamai, Higashikurume, all of Japan

[73] Assignee: Sony Corporation, Tokyo, Japan

[21] Appl. No.: 447,874

[22] Filed: Dec. 8, 1982

[30] Foreign Application Priority Data

Dec. 15, 1981 [JP] Japan .............................. 56-201916

[51] Int. Cl.³ .......................................... H04N 9/491
[52] U.S. Cl. .................................... 358/330; 358/343
[58] Field of Search .............. 358/310, 315, 327, 330, 358/340, 343, 328; 360/18, 19.1, 20, 21

[56] References Cited

U.S. PATENT DOCUMENTS

| | | | |
|---|---|---|---|
| 3,830,968 | 8/1974 | Redlich | 358/343 |
| 4,007,482 | 2/1977 | Amari | 358/328 |
| 4,007,484 | 2/1977 | Amari | 358/328 |
| 4,208,671 | 6/1980 | Ozawa | 358/330 |
| 4,353,090 | 10/1982 | Broadbent | 358/343 |
| 4,453,186 | 6/1984 | Watatani | 360/19.1 |

*Primary Examiner*—Michael A. Masinick
*Attorney, Agent, or Firm*—Lewis H. Eslinger; Alvin Sinderbrand

[57] ABSTRACT

A video and audio signal recording apparatus includes frequency-modulators in which an audio signal, for example, a stereophonic left signal, modulates first and second carriers with different frequencies so as to provide first and second FM audio signals, respectively, a first mixing circuit for mixing the first FM audio signal with a video signal, such as, a composite color video signal having a frequency modulated luminance component signal in a frequency band separated from the band of a frequency-converted chrominance component signal so as to provide an interval therebetween for accommodating the FM audio signals, a second mixing circuit for mixing the second FM audio signal with the video signal, first and second magnetic heads respectively receiving first and second mixed audio and video signals from the first and second mixing circuits, respectively, for recording in respective record tracks which are adjacent each other on a magnetic record medium, the heads and record medium having a magnetic characteristic which varies with the frequency of the signal being recorded, and the levels of the FM audio signals in the first and second mixed signals being substantially less than the levels of the FM luminance and frequency converted chrominance signal and different from each other in the sense to compensate for the magnetic characteristic which varies with frequency. The levels of the FM audio signals in the first and second mixed audio and video signals are desirably varied upon changes in the level of the audio signal to be recorded.

32 Claims, 10 Drawing Figures

VTR WITH HIGH-QUALITY AUDIO RECORDING SYSTEM

BACKGROUND OF THE INVENTION

1. Field of the Invention

This invention relates generally to an apparatus for magnetically recording video and audio signals, such as may constitute a television signal, and more particularly is directed to improvements in the recording of the audio signal in such an apparatus.

2. Description of the Prior Art

In video tape recorders according to the prior art for recording a color television signal on a magnetic tape, the chrominance and luminance signal components which constitute the color video signal are separated, and the chrominance signal component has its carrier frequency converted to a relatively low value, while the luminance component frequency modulates a relatively high frequency carrier, whereupon the frequency-converted chrominance signal component and the high side band of the frequency-modulated luminance signal component (hereinafter simply referred to as the "FM luminance signal") are mixed or combined to form a composite color video signal which is recorded on a magnetic tape in successive, parallel record tracks extending obliquely in respect to the longitudinal or running direction of the magnetic tape. In such existing system for recording a color television signal, the audio signal thereof is recorded on the magnetic tape in record tracks which extend in the longitudinal direction, that is, the running direction of the magnetic tape, and are hereinafter referred to simply as "audio tracks".

In the above described recording system of the prior art, the oblique or slant tracks which are skewed relative to the tape and in which the composite color video signal, comprised of the frequency-converted chrominance signal component and the frequency-modulated luminance signal component, is recorded, are formed by first and second substantially diametrically opposed rotary magnetic heads both supplied with the composite color video signal and alternately scanning the magnetic tape along a path at an angle to the longitudinal direction in which the tape is transported. In order to increase the recording density of the color video signal on the tape and thereby increase the duration of the recording, it has been known to restrict the speed at which the magnetic tape is transported during recording so that the successive slant tracks scanned by the rotary magnetic heads will be closely or immediately adjacent to each other, that is, so that spaces or so-called guard band between the adjacent slant tracks will be eliminated. However, in such case, the problem of "cross talk" arises in the reproducing or playback mode of the apparatus. In other words, during reproducing or playback, a transducer or head scanning one of the slant tracks for reproducing the composite color video signal recorded therein will also pick up or reproduce signals or cross talk from the next adjacent tracks.

The problem of cross talk has been substantially solved, at least in respect to the relatively high frequency frequency-modulated luminance signal component of the recorded composite color video signal, by providing the first and second rotary magnetic heads with different azimuth angles so that the composite color video signal will be recorded in each slant track by means of a magnetic head having an azimuth angle different from the azimuth angle of the head with which the composite color video signal is recorded in the next adjacent tracks. Thereafter, during reproducing or playback, each slant track is scanned by a rotary magnetic head having the corresponding azimuth angle with the result that a substantial azimuth loss is experienced as to the relatively high frequency components of the cross talk from the adjacent tracks. Thus, the cross talk in respect to the frequency-modulated luminance signal component is substantially suppressed.

However, the azimuth loss effect is rather poor in respect to the low frequency band of the cross talk, that is, in respect to the frequency-converted chrominance signal component, so that other measures need to be taken for eliminating or minimizing the low-frequency component of the cross talk. For example, as disclosed in detail in U.S. Pat. No. 4,007,482, issued Feb. 8, 1977, and having a common assignee herewith, cross talk in respect to the frequency-converted chrominance signal situated in a relatively low frequency band is substantially eliminated by recording the chrominance signal component with different first and second carriers in the adjacent tracks, respectively. Such first and second carriers modulated by the chrominance signal component recorded in adjacent tracks, respectively, may be distinguished from each other by their respective frequency and/or polarity characteristics so that, upon reproduction of the signal recorded in a particular track, the low frequency band of the cross talk from the tracks next adjacent thereto can be conveniently suppressed or eliminated by reason of the different frequency and/or polarity or phase characteristics of the respective carriers.

In the above described system for recording and reproducing a color television signal, each of the audio signals thereof, for example, the left and right stereophonic sound signals, is supplied to a respective fixed head which is continuously in contact with the magnetic tape adjacent a longitudinal edge of the latter so that the left and right stereophonic sound signals are respectively recorded in audio tracks extending longitudinally along the magnetic tape.

It will be appreciated that, when high density recording of the color video signal in successive slant tracks on the tape is effected as described above, the rotational speed of the rotary magnetic heads may be relied upon to provide the desired relatively high speed of each rotary magnetic head in respect to the magnetic tape for ensuring high quality recording of the color video signal in the slant or skewed tracks. However, for achieving the high density recording of the color video signal, the transport speed of the magnetic tape is necessarily quite low, for example, about 1.33 cm/sec. Thus, the relative velocity between the magnetic tape and the fixed heads which record the audio signals in the respective audio tracks is quite low with the result that the quality of the audio recording is deteriorated.

In order to solve the above problem associated with the recording of the audio signals, it has been proposed that the audio signals be frequency-modulated and then mixed with the composite color video signal to provide a mixed or combined signal supplied to the rotary magnetic heads for recording by the latter in the slant tracks. Although the foregoing proposal ensures that the relative speed of the rotary magnetic heads in respect to the magnetic tape will be sufficient to ensure that the recording quality of the audio signals will not be deleteriously affected by an inadequate head-to-tape speed, the reproduced audio signals are still of insufficient quality. More particularly, in the existing proposal for recording frequency-modulated audio signals along with the composite color video signal in the slant tracks on the magnetic tape, the frequency-modulated audio signals recorded in the next adjacent tracks have the same carrier frequency. Therefore, each audio signal reproduced from a particular track contains a zero beat interference due to the audio component of the cross talk from the adjacent tracks even though the level of such cross talk may be somewhat reduced by the previously mentioned azimuth loss.

Further, when frequency-modulated audio signals are recorded with the composite color video signal in the slant tracks on the magnetic tape, there is a danger that, if the levels of the recorded frequency-modulated audio signals are sufficient to provide an adequate S/N ratio, a beat or interference will occur between such audio signals and the luminance and chrominance components of the composite color video signal. Moreover, such problem of possible beating or interference between the frequency-modulated audio signals and the composite color video signal, and particularly the frequency-converted chrominance signal thereof, is accentuated when the head or heads and magnetic record medium have a magnetic characteristic varying with frequency.

OBJECTS AND SUMMARY OF THE INVENTION

Accordingly, it is an object of this invention to provide apparatus for recording video and audio signals and which avoids the previously described problems associated with the apparatus of the prior art.

More specifically, it is an object of this invention to provide an apparatus for recording video and audio signals, and which is capable of high density recording of the video signal as well as the high quality recording of the audio signal or signals.

Another object of this invention is to provide an apparatus, as aforesaid, which can record plural channels of audio signals, for example, left and right stereophonic sound signals, while effecting the high density recording of a video signal, and without deteriorating the qualities of either the audio or video signals.

Still another object of this invention is to provide an apparatus, as aforesaid, which can record video and audio signals without beating or interference therebetween and with a sufficiently high S/N ratio for the recorded audio to ensure the high quality thereof.

According to an aspect of this invention, an apparatus for recording color video and audio signals comprises frequency-modulating means for modulating a plurality of carriers having different frequencies by an audio signal to be recorded and thereby providing a corresponding plurality of respective frequency-modulated audio signals, video signal processing means receiving a color video signal composed of luminance and chrominance components and in which an additional carrier having a frequency substantially higher than that of each of the carriers of said frequency-modulated audio signals is modulated by said luminance component so that the resulting frequency-modulated luminance signal is in a band of which at least the major part is above a band containing said frequency-modulated audio signals, and further in which said chrominance component is frequency converted to a frequency converted chrominance signal in a relatively low frequency band spaced from said band of said frequency-modulated luminance signal to provide a gap therebetween in which said frequency-modulated FM audio signals are situated, first mixing means for mixing said frequency-modulated luminance signal and said frequency converted chrominance signal with one of said frequency-modulated audio signals and thereby providing a first mixed audio and video signal, second mixing means for mixing said frequency-modulated luminance signal and said frequency converted chrominance signal with another of said frequency-modulated audio signals and thereby providing a second mixed audio and video signal, first and second magnetic heads respectively receiving said first and second mixed audio and video signals from said first and second mixing means for recording said first and second mixed signals in respective record tracks on a magnetic record medium, said heads and record medium having a magnetic characteristic which varies with the frequency of the signal being recorded, and the levels of said frequency-modulated audio signals, in said first and second mixed signals, being substantially less than the levels of said frequency-modulated luminance and frequency converted chrominance signals, with said levels of the frequency-modulated audio signals being different from each other in the sense to compensate for said magnetic characteristic which varies with frequency.

In accordance with another aspect of this invention, the levels of said frequency-modulated audio signals in the first and second mixed signals are varied upon changes in the level of the respective audio signal to be recorded. In specific embodiments of this aspect of the invention, the varying of said levels of the frequency-modulated audio signals may be effected by a plurality of variable gain amplifiers through which said frequency-modulated audio signals are respectively supplied to the first and second mixing means. Such variable gain amplifiers may be controlled in accordance with the level of the audio signal prior to the modulation of the carriers thereby, or the variable gain amplifiers may be controlled in accordance with detected frequency deviations of the frequency-modulated audio signals respectively supplied thereto.

The above, and other objects, features and advantages of the present invention, will be apparent from the following detailed descriptions of illustrative embodiments which are to be read in conjunction with the accompanying drawings in which the same reference numerals identify the corresponding elements and parts in the several views.

BRIEF DESCRIPTION OF THE DRAWINGS

FIG. 9 is a diagram similar to that of FIG. 3, but showing a major portion of the frequency spectrum of the signal to be recorded by the apparatus of FIG. 8; and FIG. 10 is a schematic block diagram illustrating a modification of the embodiment of FIG. 8.

DESCRIPTION OF PREFERRED EMBODIMENTS

Figure 1:
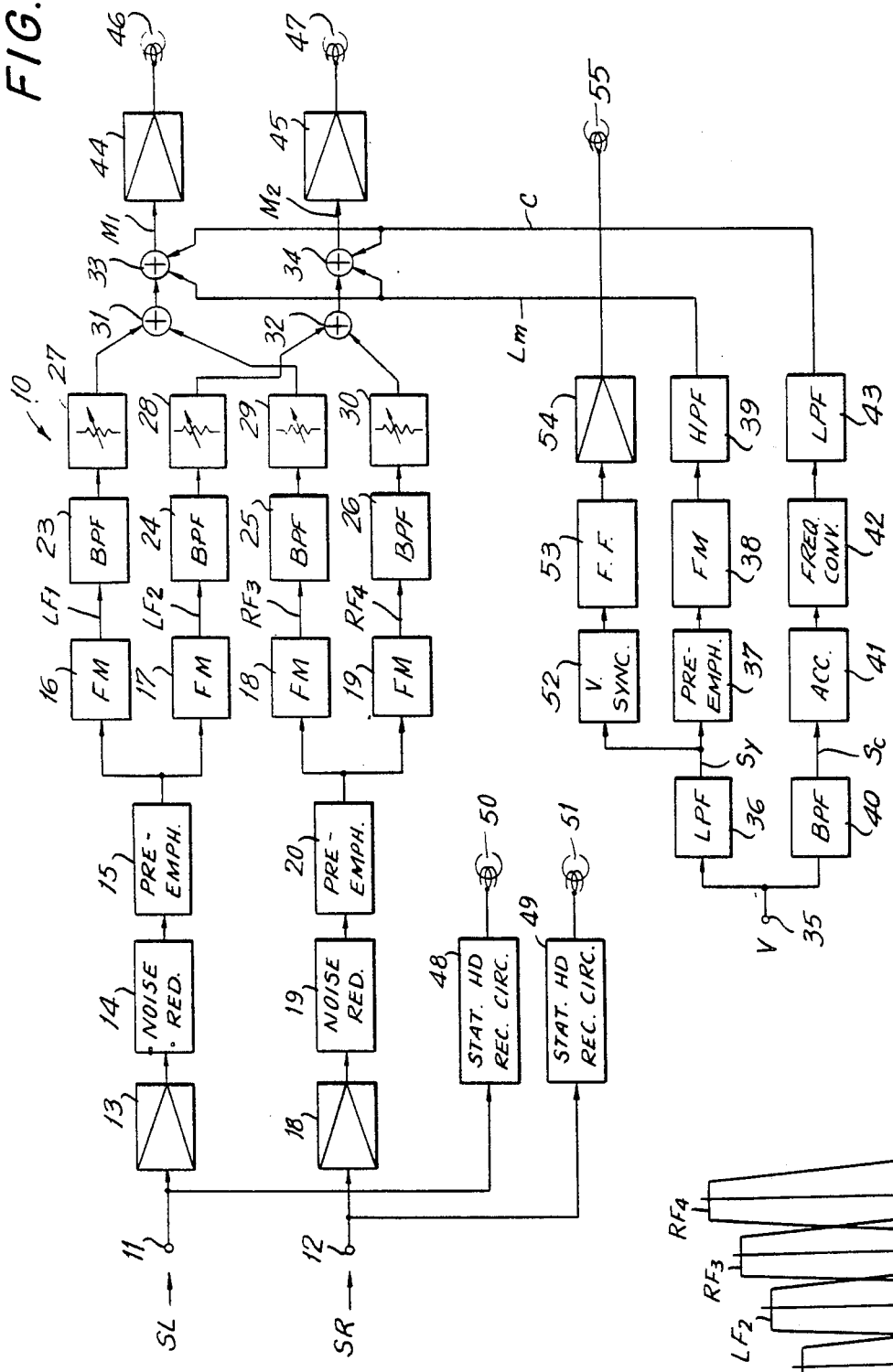
FIG. 1 is a schematic block diagram illustrating a video and audio signal recording apparatus according to an embodiment of this invention.

Referring to the drawings in detail, and initially to FIG. 1 thereof, it will be seen that the invention is there shown applied to a video and audio signal recording apparatus 10 having two audio signal input terminals 11 and 12 to which there are supplied first and second audio signals, for example, a left channel signal SL and a right channel signal SR of a stereophonic sound or audio signal. The left channel signal SL is supplied from terminal 11 through an automatic gain control amplifying circuit 13, a noise reduction circuit 14, and a pre-emphasis circuit 15, in succession, to first and second frequency modulators (FM modulators) 16 and 17. Similarly, the right channel signal SR is supplied from terminal 12 through an automatic gain control amplifying circuit 18, a noise reduction circuit 19 and a pre-emphasis circuit 20, in succession, to third and fourth frequency modulators (FM modulators) 21 and 22.

Figure 2:
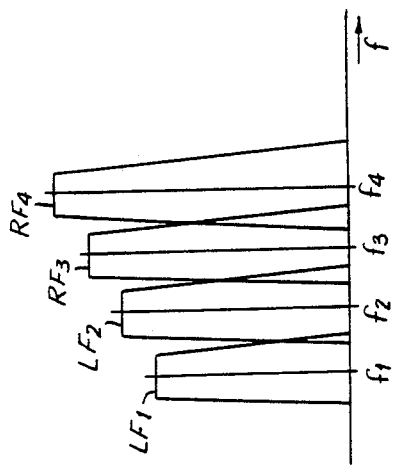
FIG. 2 is a diagram showing the frequency spectrum of frequency-modulated audio signals and to which reference will be made in explaining operation of the apparatus of FIG. 1.

The first frequency modulator 16 frequency modulates a carrier having a frequency $f_1$ (FIG. 2), for example, of 1.325 MHz, by the left channel signal SL so as to provide a frequency shift or deviation of the carrier of about 100 to 150 KHz, and to provide at the output of FM modulator 16 a frequency modulated left channel signal or first FM audio signal $LF_1$. The second frequency modulator 17 similarly frequency-modulates, by means of the left channel signal SL, a carrier having a frequency $f_2$, for example, of 1.475 MHz, which is higher than the frequency $f_1$ so as to provide at the output of frequency modulator 7 another frequency modulated left channel signal, hereinafter referred to as a second FM audio signal $LF_2$ having the same frequency shift width or deviation as the first FM audio signal $LF_1$, that is, a frequency deviation of about 100 to 150 KHz, but around a different central frequency. The third and fourth frequency modulators 21 and 22 employ the right channel signal $S_R$ to frequency-modulate a carrier having a frequency $f_3$, for example, of 1.625 MHz, higher than the frequency $f_2$, and a carrier having a frequency $f_4$, for example, of 1.775 MHz, higher than the frequency $f_3$. The frequency modulators 21 and 22 also provide a frequency shift width or deviation of the respective carriers of about 100 to 150 KHz in response to the modulating right channel signal SR, and provide, at their respective outputs, frequency modulated right channel signals $RF_3$ and $RF_4$, hereinafter referred to as third and fourth FM audio signals, which have frequency shift or deviation bands different from each other and also different from the frequency shift or deviation bands of the first and second FM audio signals $LF_1$ and $LF_2$, respectively, as shown on FIG. 2.

In the foregoing example of the invention, the central frequencies $f_1$, $f_2$, $f_3$ and $f_4$ of the carriers are selected so that the differences between adjacent carrier frequencies, that is, 150 KHz, will cause the beat noise component between the left FM signals $LF_1$ and $LF_2$ and the right FM signals $RF_3$ and $RF_4$, after being demodulated, to be outside the reproduced audio signal band.

The first and second or left FM audio signals $LF_1$ and $LF_2$ and the third and fourth or right FM audio signals $RF_3$ and $RF_4$ are passed from modulators 16, 17, 21 and 22 through corresponding band-pass filters 23, 24, 25 and 26, respectively. The FM audio signals $LF_1$, $LF_2$, $RF_3$ and $RF_4$ have their respective levels suitably established in accordance with a predetermined relationship, as hereinafter described in detail, for example, by being passed through level-controlling or -determining devices 27, 28, 29 and 30, respectively, which may be constituted by variable gain amplifiers.

The left FM signal $LF_1$, that is, the first FM audio signal, from level-controlling device 27 and the right FM signal $RF_3$, that is, the third FM audio signal from level-controlling device 29 are supplied to a mixer 31, while the left FM signal $LF_2$ or second FM audio signal from level-controlling device 28 and the right FM signal $RF_4$ or fourth FM audio signal from level-controlling device 30 are supplied to a mixer 32. The mixed output of mixer 31, that is, the first FM audio signal $LF_1$ combined with the third FM audio signal $RF_3$, is applied to an adder or mixer 33 to be mixed in the latter with a composite video signal composed of a frequency-modulated luminance signal $L_m$ and a chrominance signal C, so as to provide therefrom a first mixed audio and video signal $M_1$ at an output of mixer 33. Similarly, the output of mixer 32, that is, the second FM audio signal $LF_2$ combined with the fourth FM audio signal $RF_4$ is supplied to an adder or mixer 34 so as to be mixed or combined in the latter with the frequency-modulated luminance signal $L_m$ and the chrominance signal C constituting the composite color video signal for providing, at the output of mixer 34, a second mixed audio and video signal $M_2$.

The frequency-modulated luminance signal $L_m$ and chrominance signal C may be provided by a simplified video signal processing circuit shown on FIG. 1 to comprise an input terminal 35 which receives a color video signal V containing both luminance and chrominance components. A low pass filter 36 receives the color video signal V from terminal 35 and separates therefrom the luminance component $S_y$ which is passed through a pre-emphasis circuit 37 to a frequency modulator 38 in which a carrier with a selected central frequency is frequency modulated by the luminance component to provide the frequency modulated luminance component $L_m$ passed through a high pass filter 39 to each of the adders 33 and 34. The color video signal V applied to terminal 35 is also supplied from the latter to a band pass filter 40 which separates the chrominance component $S_c$ from the color video signal and passes the chrominance component through an automatic color control circuit 41 to a frequency converter 42 in which the chrominance component is converted to a frequency band lower than that of the frequency modulated signal $L_m$ supplied to adders 33 and 34. The resulting frequency-converted chrominance component C is supplied through a low pass filter 43 to additional inputs of adders 33 and 34 so as to be combined, in the latter, with the frequency modulated luminance component $l_m$ and with the outputs of mixers 31 and 32 for providing the mixed audio and video signals $M_1$ and $M_2$, respectively. Such mixed signals $M_1$ and $M_2$ supplied through recording amplifiers 44 and 45 to magnetic heads 46 and 47, respectively, which preferably have different azimuth angles and which, in a recording mode of apparatus 10, are operative to record the mixed signals $M_1$ and $M_2$ in parallel adjacent record tracks on a magnetic record medium.

Figure 6:
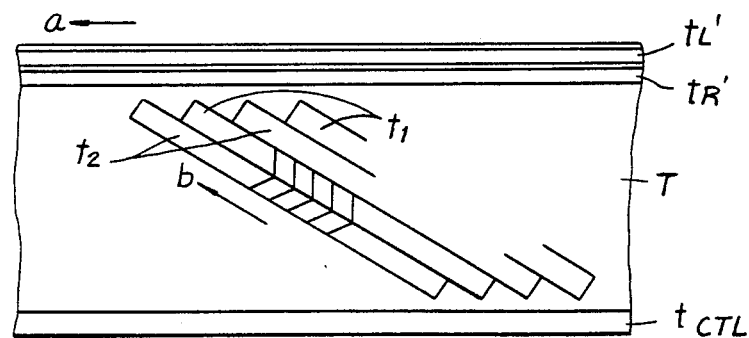
FIG. 6 is a diagrammatic view of a section of magnetic tape, and illustrating record tracks thereon in which video and audio signals are recorded in accordance with this invention.

When the invention is desirably applied to a helical scan video tape recorder (VTR), the magnetic record medium is in the form of a magnetic tape T (FIG. 6) which is suitably guided in a helical path about a substantial portion of the periphery of a guide drum (not shown), and the magnetic heads 46 and 47 are diametrically opposed and rotatably mounted in association with the guide drum for movement in a circular path coinciding with the drum periphery. In that case, during operation of apparatus 10 in the recording mode, heads 46 and 47 are rotated to alternately move obliquely across magnetic tape T, as indicated by the arrow b on FIG. 6, while tape T is suitably driven in the longitudinal direction indicated by the arrow a, whereby head 46 scans alternating slant or oblique tracks indicated at $t_1$ while head 47 scans the remaining alternating tracks indicated at $t_2$. Thus, if one considers any of the next adjacent parallel slant tracks on tape T, such tracks $t_1$ and $t_2$ are respectively scanned by the heads 46 and 47. Usually, but not necessarily, each of tracks $t_1$ and $t_2$ has recorded therein the video signal information corresponding to a respective field interval of the video signal. Since the heads 46 and 47 have air gaps arranged at substantially different azimuth angles in respect to the plane of rotation of heads 46 and 47, each of the heads, when recording the respective mixed audio and video signal $M_1$ or $M_2$ in the respective tracks on tape T, effects magnetization of magnetic domains in the magnetic coating of the tape in what would appear to be, if such domains were visible, a series of parallel lines or stripes extending across the respective track and each having an orientation that corresponds to the azimuth angle of the respective head. Furthermore, during recording, the speed of advancement of tape T in the direction a is preferably selected so that there will be no guard bands or unrecorded areas between the adjacent tracks $t_1$ and $t_2$ for increasing the recording density of the color video signal on the tape.

In reproducing the mixed signals $M_1$ and $M_2$ recorded in the adjacent tracks $t_1$ and $t_2$ by means of magnetic heads 46 and 47, respectively, or by other reproducing or playback heads having corresponding azimuth angles and alternately scanning the tracks $t_1$ and $t_2$, as each head scans the respective track, the well-known azimuth loss results in attenuation of the signals reproduced by that head from the adjacent tracks. Since such azimuth loss is generally proportional to the frequency of the signal, azimuth loss is relatively ineffective to decrease or eliminate interference due to cross-talk from the low frequency or frequency-converted chrominance component of the recorded composite color video signal. Thus, although the apparatus 10 of FIG. 1 is shown, for the sake of simplicity, to merely frequency-convert the chrominance component of the incoming color video signal V for providing a relatively low frequency band for the chrominance component C of the composite color video signal included in mixed signals $M_1$ and $M_2$, the present invention may also be desirably applied to a recording apparatus of the type disclosed in the previously mentioned U.S. Pat. No. 4,007,482, or in U.S. Pat. No. 4,007,484, also issued Feb. 8, 1977 and having a common assignee herewith, and in which interference or cross-talk between low frequency signals recorded in adjacent tracks is reduced or eliminated by recording the chrominance component with different first and second carriers in the adjacent tracks $t_1$ and $t_2$. Such first and second carriers modulated by the chrominance component $S_c$ for recording in adjacent tracks, respectively, may be distinguished from each other by their respective frequency and/or polarity characteristics so that, upon reproduction of the signal recorded in a particular track $t_1$ or $t_2$, the low frequency band of the cross talk from the tracks $t_2$ or $t_1$, respectively, adjacent thereto can be conveniently suppressed or eliminated by reason of the different frequency and/or polarity or phase characteristics of the respective carriers.

Referring again to FIG. 1, it will be seen that apparatus 10 preferably further includes stationary head recording circuits 48 and 49 through which left channel signal SL and right channel signal SR are supplied from input terminals 11 and 12 to fixed magnetic heads 50 and 51, respectively, disposed adjacent tape T and being operative, in the recording mode of apparatus 10, to record the left channel signal SL and the right channel signal SR in respective longitudinal tracks $t_L$ and $t_R$ extending along a longitudinal edge of tape T (FIG. 6), as in a conventional VTR.

In order to permit the alternating slant or oblique record tracks $t_1$ and $t_2$ to be distinguished from each other when reproducing the signals recorded therein, recording apparatus 10 may further include a vertical sync separator 52 which separates the vertical synchronizing signals from the luminance component $S_Y$ passing through low pass filter 36. The separated vertical synchronizing signals are applied to a flip-flop 53 which provides control signals CTL occurring in correspondence with the recording of color video signals in alternating or every other one of the tracks $t_1$ and $t_2$. The control signals from flip-flop 53 are applied through an amplifier 54 to a fixed head 55 which is disposed adjacent the longitudinal edge portion of tape T remote from the conventional audio tracks $t_L$ and $t_R$. Thus, as tape T is longitudinally advanced during a recording operation of apparatus 10, head 55 records control signals CTL in the longitudinal track $t_{CTL}$ appearing on FIG. 6 for identifying the slant tracks $t_1$ and $t_2$ in which signals are recorded by the rotary heads 46 and 47, respectively.

Figure 3:
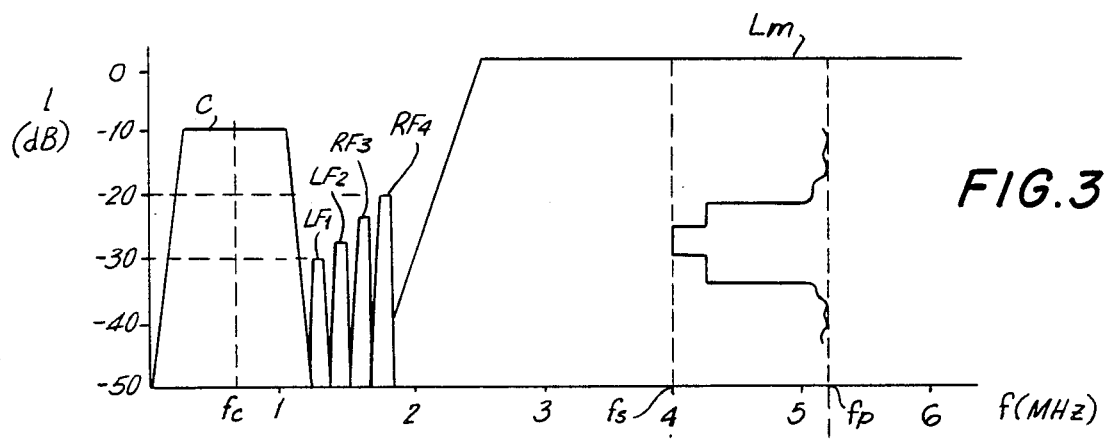
FIG. 3 is a diagram showing the frequency spectrum of the frequency-modulated audio signals of FIG. 2 together with the chrominance and luminance components of a video signal, and to which reference will also be made in explaining various operations of the apparatus of FIG. 1.

Referring now to FIG. 3, it will be seen that the frequency $f_c$ of the color sub-carrier of the frequency-converted chrominance signal C has a sufficiently low value, for example, 688 kHz, so that the resulting low frequency band of chrominance signal C will be below the band of the first FM audio signal $LF_1$ having the previously mentioned central frequency $f_1$ of 1.325 MHz. Further, the central frequency of the carrier to be modulated by the luminance component $S_Y$ in frequency modulator 38 is selected, for example at 4.6 MHz, and the modulation degree is selected so that, in the resulting frequency-modulated luminance signal $L_m$, the sync signal of the luminance component corresponds to a frequency $f_s$, for example, of 4.0 MHz, which is substantially higher than the central frequency $f_4$ of FM audio signal $RF_4$, while the white peak or maximum amplitude of the luminance component corresponds to a frequency $f_p$, for example, of 5.2 MHz, which is higher than the frequency $f_s$ by a predetermined amount, that is, by 1.2 MHz in the example given. It will be appreciated from FIG. 3, that, with such exemplary values given for the color sub-carrier frequency $f_c$ of the frequency-converted chrominance signal C, and for the frequencies $f_s$ and $f_p$ of the frequency-modulated luminance signal $L_m$, the resulting composite color video signal to be recorded in tracks $t_1$ and $t_2$ has a gap or space in its spectrum between the frequency-converted chrominance signal C and the frequency-modulated luminance signal $L_m$ for substantially accommodating the FM audio signals $LF_1$, $LF_2$, $RF_3$ and $RF_4$.

It will be appreciated that the sequentially arranged left FM signals $LF_1$ and $LF_2$ and right FM signals $RF_3$ and $RF_4$ are located close to one another in the space or gap between the bands of the frequency-converted chrominance signal C and the frequency-modulated luminance signal $L_m$ so as to reduce, as much as possible, the gap that needs to be provided between the signals C and $L_m$ of the composite video signal and thereby minimize suppression of the latter required for accommodating the FM audio signals $LF_1$, $LF_2$, $RF_3$ and $RF_4$.

Figure 4:
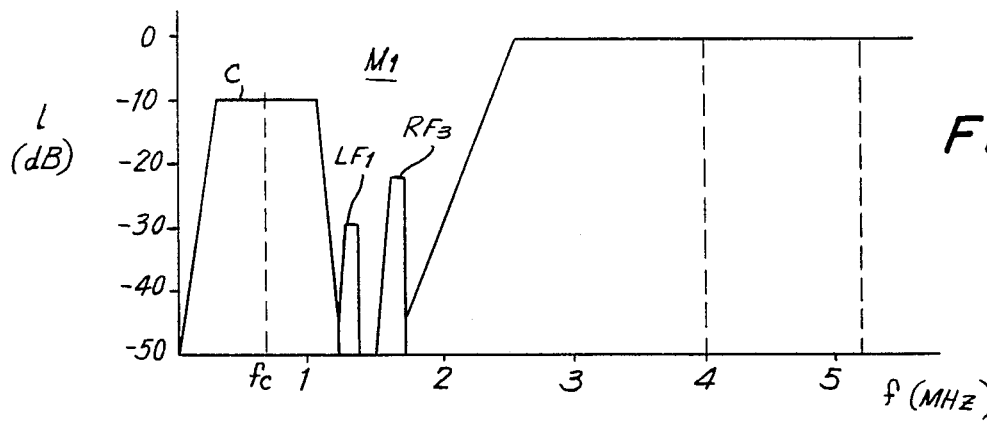
FIGS. 4 and 5 are diagrams showing the frequency spectra of mixed signals which are recorded in parallel adjacent tracks, respectively, by the apparatus of FIG. 1.
Figure 5:
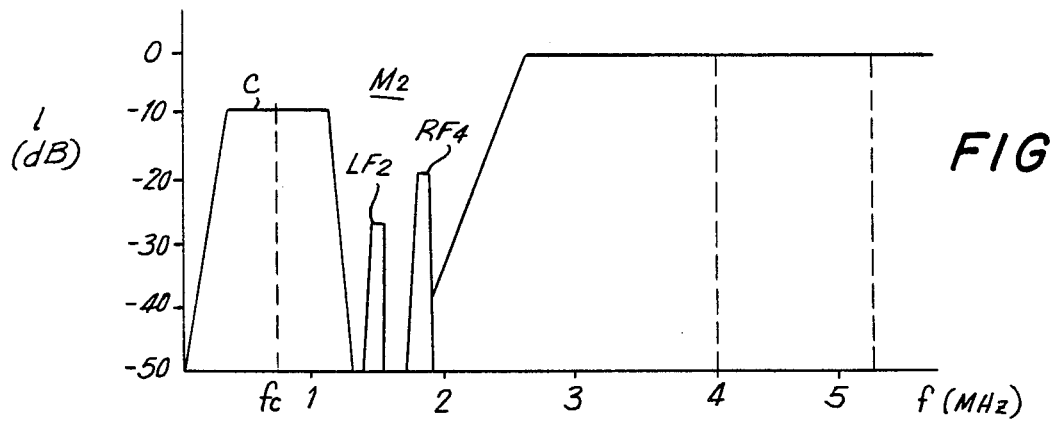

As earlier noted, the first mixed signal $M_1$, in which frequency-converted chrominance signal C and frequency-modulated luminance signal $L_m$ are mixed with left FM signal $LF_1$ and right FM signal $RF_3$, is supplied from adder 33 through amplifier 44 to rotary magnetic head 46. The second mixed signal $M_2$, in which the frequency-converted chrominance signal C and the frequency-modulated luminance signal $L_m$ are mixed with the left FM signal $LF_2$ and the right FM signal $RF_4$, is supplied from adder 34 through amplifier 45 to rotary magnetic head 47. These rotary magnetic heads 46 and 47, which have different azimuth angles, alternately form or scan the oblique or slant tracks $t_1$ and $t_2$, respectively, with no guard bands therebetween, whereby the first and second mixed signals $M_1$ and $M_2$ having the frequency spectra shown in FIGS. 4 and 5, respectively, are alternately recorded in such tracks $t_1$ and $t_2$. It will be appreciated therefrom that, the FM audio signals recorded in each track $t_1$, that is, the left FM signal $LF_1$ and the right FM signal $RF_3$ do not have adjacent frequency bands. Similarly, the FM audio signals recorded in each track $t_2$, that is, the left FM signal $LF_2$ and the right FM signal $RF_4$ do not have adjacent frequency bands. Further, it will be appreciated that the FM audio signals $LF_1$ and $RF_3$ are recorded in each track $t_1$ by the rotary head 46 with an azimuth angle different from that with which the head 47 records the FM audio signals $LF_2$ and $RF_4$ in each adjacent track $t_2$. Furthermore, the carrier frequencies $f_1$ and $f_3$ and the carrier frequencies $f_2$ and $f_4$ of the FM audio signals recorded in the adjacent slant tracks $t_1$ and $t_2$, respectively, are not coincident with each other.

At the same time that the FM audio signals contained in mixed signals $M_1$ and $M_2$ are being recorded along with the composite color video signal in slant tracks $t_1$ and $t_2$ by means of rotary heads 46 and 47, apparatus 10 may also record the left and right channel signals SL and SR in longitudinal tracks $t_{L'}$ and $t_{R'}$ by means of fixed heads 50 and 51 so that the tape T thus recorded can be played back or is compatible with a conventional VTR in which only fixed heads are provided for reproducing the recorded audio signals.

In respect to the FM audio signals recorded with the frequency-converted chrominance signal C and the frequency-modulated luminance signal $L_m$ by the rotary magnetic heads 46 and 47 in the slant tracks $t_1$ and $t_2$, it will be appreciated that, since the relative speed of rotary heads 46 and 47 in respect to magnetic tape T is selected to be sufficiently high for recording the video signal, such high relative speed ensures high quality recording of the audio signals, such as the stereophonic left channel signal and right channel signal, while using a narrow frequency band for the corresponding FM audio signals $LF_1$, $LF_2$, $RF_3$ and $RF_4$ for preventing suppression of the frequency band of the composite color video signal.

Figure 7:
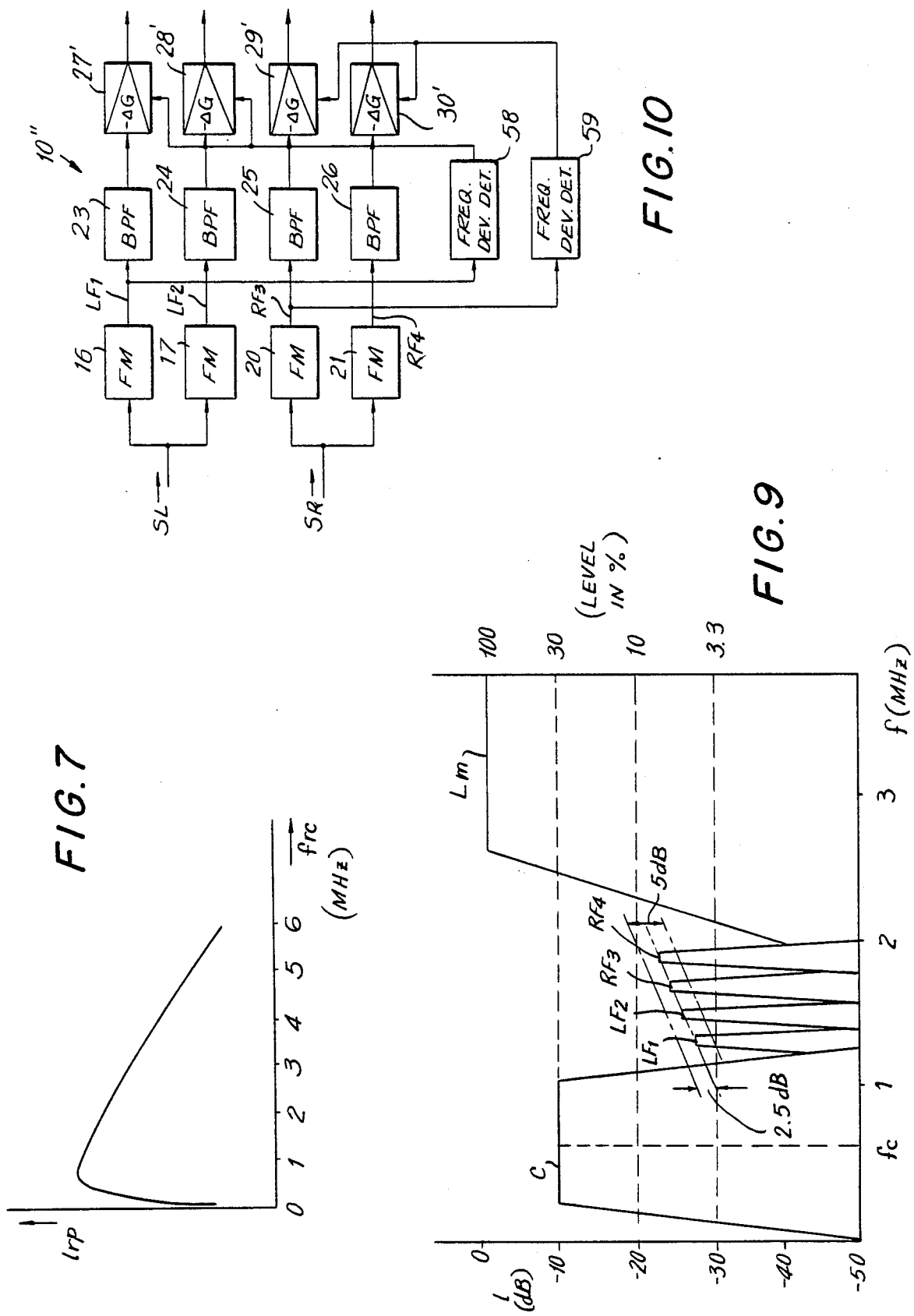
FIG. 7 is a graphic representation of the magnetic characteristic of magnetic heads and the magnetic tape when recording on the latter.

As is conventional and shown on FIG. 3, the level of the frequency-converted chrominance signal C, as applied to adders 33 and 34, is desirably substantially smaller than the level of the frequency-modulated luminance signal $L_m$, for example, the level of signal C may be $-10$ dB in respect to the level of the signal $L_m$. Further, as shown on FIG. 7, the heads 46 and 47 and magnetic tape T have a magnetic characteristic which varies with the frequency of the signal being recorded. More particularly, in the frequency band of the FM audio signals $LF_1,LF_2,RF_3$ and $RF_4$, that is, in the band between approximately 1.0 and 2.0 MHz, the characteristic curve slopes downwardly with increasing signal frequency, that is, if the signal to be recorded was of constant level, the level $l_{rp}$ of the signal, as actually recorded, would decline with increasing signal frequency $f_{rc}$. In order to compensate for the foregoing and thereby ensure that the FM audio signals $LF_1,LF_2,RF_3$ and $RF_4$, as actually recorded in the slant tracks, are of the same levels, level-controlling devices 27,28,29 and 30, in the recording apparatus 10 according to this invention, are adjusted so that FM audio signals $LF_1,LF_2,RF_3$ and $RF_4$, as applied to mixers 31 and 32 will have successively increased values, that is, so that $LF_1<LF_2<RF_3<RF_4$, as shown on FIGS. 2 and 3. Further, in accordance with this invention and as shown on FIG. 3, the level-controlling devices 27,28,29 and 30 are adjusted so that the levels of FM audio signals $LF_1,LF_2,RF_3$ and $RF_4$ are within the range from about $-20$ dB to about $-30$ dB in respect to the level of the FM luminance signal $L_m$.

When the foregoing conditions are satisfied, that is, $LF_1<LF_2<RF_3<RF_4$ within the range of $-20$ dB to $-30$ dB relative to the level of $L_m$, and the level of C is $-10$ dB relative to the level of $L_m$, the level of FM audio signal $LF_1$ closest to the relatively low level frequency-converted chrominance signal C is sufficiently small to avoid beat interference therebetween and, at the other end of the band of the FM audio signals, the level of FM luminance signal $L_m$ is so large as to avoid beat interference with the adjacent FM audio signal $RF_4$. Further, such desirable results are achieved while ensuring that the several FM audio signals with different carrier frequencies will be recorded at the same levels, thereby to ensure high-quality recording.

When the composite color video signal and the FM audio signals are recorded together in slant tracks $t_1$ and $t_2$ in accordance with the present invention, the corresponding audio signals, for example, the left and right channel stereophonic sound signals can be reproduced with good separation from each other and with minimized interference due to cross talk from adjacent tracks. Further, the head-to-tape speed for recording and reproducing the FM audio signals in the slant tracks is substantially independent of the speed of advancement of the tape. In apparatus (not shown) for reproducing such recorded signals, which apparatus forms no part of the present invention and may be of the kind described in greater detail in U.S. patent application Ser. No. 447,875 filed Dec. 8, 1982 of Takashi Kono, Shinji Kakuyama and Toshimitsu Kamai, having a common assignee herewith, and the adjacent slant tracks $t_1$ and $t_2$ in which the first and second mixed signals $M_1$ and $M_2$ have been recorded with different azimuth angles, are scanned by respective first and second magnetic heads having corresponding azimuth angles so as to alternately reproduce the first and second mixed signals $M_1$ and $M_2$. The FM audio signals $LF_1$ and $RF_3$ and the FM audio signals $LF_2$ and $RF_4$ are separated, as by suitable band pass filters, from the reproduced first and second mixed signals $M_1$ and $M_2$, whereupon such separated FM audio signals are frequency demodulated so as to obtain respective alternately reproduced demodulated portions of the left and right channel stereophonic sound signals SL and SR. Finally, such alternately reproduced demodulated portions of the stereophonic sound signals SL and SR are sequentially combined with each other for providing substantially continuous demodulated left and right channel stereophonic sound signals. The alternately reproduced mixed signals $M_1$ and $M_2$ are also applied to a video signal processing circuit which is effective to separate the frequency-converted chrominance signal C and the frequency-modulated luminance signal $L_m$ from each other and from mixed signals $M_1$ and $M_2$, and then to reconvert the chrominance signal to its original frequency band while the frequency-modulated luminance signal is frequency-demodulated. Of course, if the chrominance signal has been recorded with different first and second carriers in the adjacent tracks $t_1$ and $t_2$, for example, as mentioned above with reference to U.S. Pat. No. 4,007,482 and No. 4,007,484, then the video signal processing circuit of the reproducing apparatus may be arranged as shown in either of those patents for suppressing or eliminating the low frequency band of cross talk between tracks $t_1$ and $t_2$ by reason of the different frequency and/or polarity or phase characteristics of the respective carriers.

Figure 8:
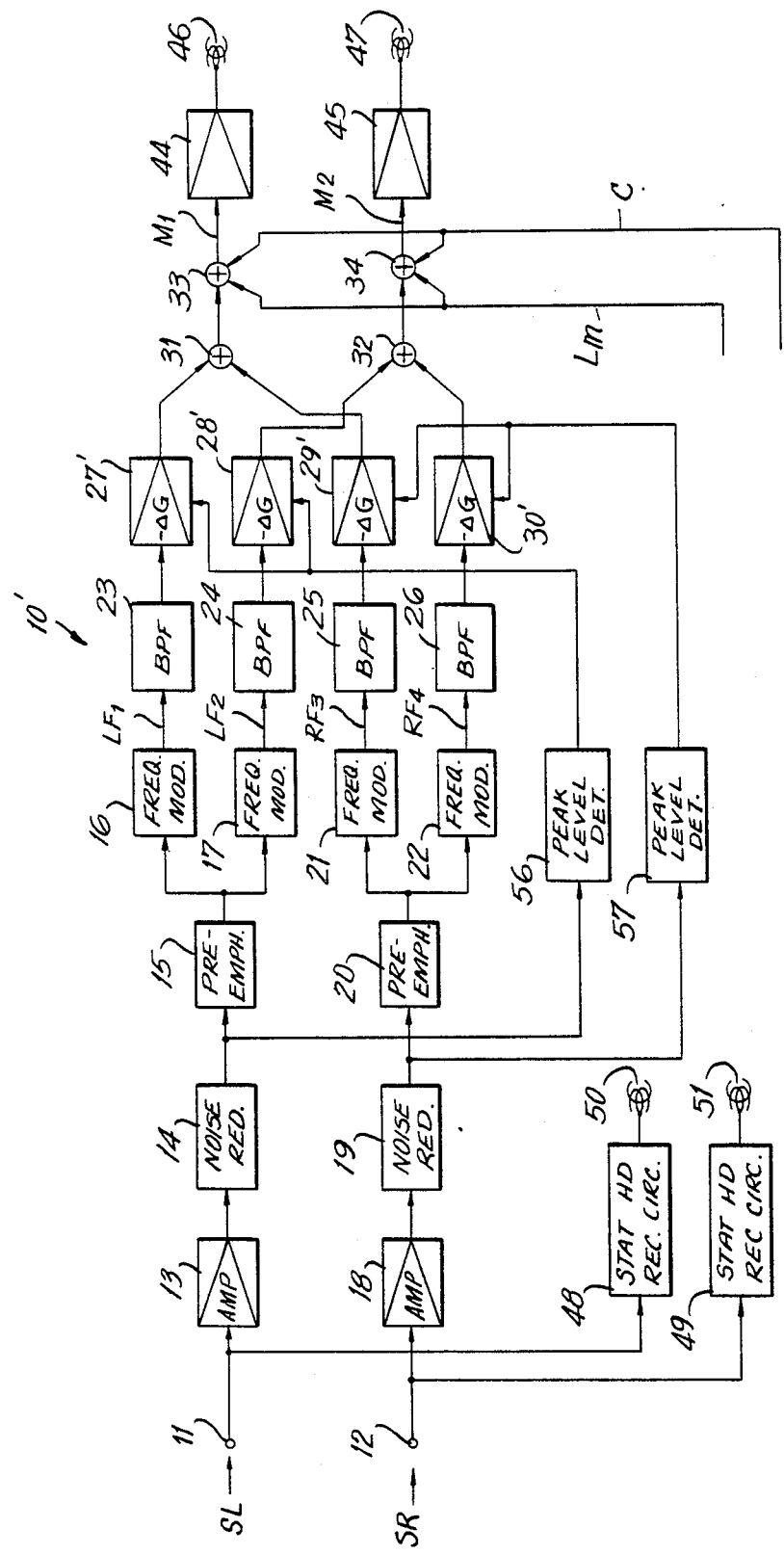
FIG. 8 is a schematic block diagram showing a video and audio signal recording apparatus according to another embodiment of this invention.

Referring now to FIG. 8, it will be seen that a recording apparatus 10' according to another embodiment of this invention is generally similar to the apparatus 10 of FIG. 1 and has its corresponding parts identified by the same reference numerals. The recording apparatus 10' differs from the first-described embodiment only in that the level-controlling devices are constituted by automatically adjusted variable gain amplifiers 27',27',29' and 30' receiving the FM audio signals $LF_1,LF_2,RF_3$ and $RF_4$ from band pass filters 23,24,25 and 26, respectively. Such automatically adjusted variable gain amplifiers 27',28',29' and 30' are operative to vary the levels of the respective FM audio signals in the first and second mixed audio and video signals $M_1$ and $M_2$ upon changes in the levels of the respective audio signals to be recorded. More particularly, variable gain amplifiers 27' and 28' are automatically adjusted to increase the gains thereof, and hence, to increase the levels of the FM audio signals $LF_1$ and $LF_2$ included in the mixed signals $M_1$ and $M_2$, respectively. upon a decrease in the level of the respective audio signal to be recorded, that is, upon a decrease in the level of the left channel stereophonic sound signal SL. Conversely, variable gain amplifiers 27' and 28' are automatically adjusted to decrease the gains thereof upon an increase in the level of left channel stereophonic sound signal SL. Similarly, variable gain amplifiers 29' and 30' are automatically adjusted to increase the gains thereof, and thereby increase the levels of the respective FM audio signals $RF_3$ and $RF_4$ included in mixed signals $M_1$ and $M_2$, respectively, upon a decrease in the level of the corresponding audio signal to be recorded, that is, the right channel stereophonic sound signal SR. Conversely, the gains of variable gain amplifiers 29' and 30' are automatically reduced upon an increase in the level of right channel stereophonic sound signal SR.

In the embodiment of this invention illustrated in FIG. 8, the gains of amplifiers 27' and 28' and of amplifiers 29' and 30' are automatically controlled in accordance with the levels of the respective audio signals, that is, the left channel stereophonic sound signal SL and the right channel stereophonic sound signal SR, respectively, prior to the frequency modulation thereof. More particularly, as shown on FIG. 8, peak level detectors 56 and 57 are connected to the outputs of noise reduction circuits 14 and 19, respectively, to provide detected outputs corresponding to the peak levels of the stereophonic sound signals SL and SR, respectively. Such detected outputs from peak level detectors 56 and 57 are applied as gain control signals to variable gain amplifiers 27' and 28' and to variable gain amplifiers 29' and 30', respectively. It will be appreciated that the gains of the amplifiers 27'-30' are varied inversely in respect to the changes in the peak levels of the sound signals sensed by detectors 56 and 57.

In a recording apparatus 10" according to another embodiment of this invention shown in part on FIG. 10 of the drawings, and which is otherwise similar to the recording apparatus 10' of FIG. 8, the variable gain amplifiers 27', 28',29' and 30' have their gains automatically adjusted in accordance with the frequency deviations of the FM audio signals $LF_1,LF_2,RF_3$ and $RF_4$ respectively supplied thereto from frequency modulators 16,17,20 and 21, respectively. Since the frequency deviation of each of the FM audio signals $LF_1,LF_2,RF_3$ and $RF_4$ is an indication of the level of the audio signal SL or SR by which the respective carrier is modulated in the frequency modulator 16,17,20 or 21, it is apparent that the recording apparatus 10" also functions to vary the levels of the FM audio signals $LF_1$ and $RF_3$ in mixed signal $M_1$ and of FM audio signals $LF_2$ and $RF_4$ in mixed signal $M_2$ upon changes in the levels of the left and right channel stereophonic sound signals SL and SR to be recorded.

More particularly, for the purpose of effecting the foregoing automatic control of variable gain amplifiers 27',28',29' and 30' in FIG. 10, the recording apparatus 10" is further shown to include a frequency deviation detector 58 which detects frequency deviations in the FM audio signal $LF_1$ from frequency modulator 16 and provides a corresponding detected output as a control signal to variable gain amplifiers 27' and 28'. Since the modulating signal is the same for frequency modulators 16 and 17, that is, the respective carriers are modulated in frequency modulators 16 and 17 by the left channel signal SL, the frequency deviations of the FM audio signals $LF_1$ and $LF_2$ will be the same, and only one of such frequency deviations needs to be detected for controlling both of the variable gain amplifiers 27' and 28'. Similarly, a frequency deviation detector 59 is connected to the output of frequency modulator 20 for detecting the frequency deviation of FM audio signal $RF_3$, and the detected output of frequency deviation detector 59 is applied, as a control signal, to variable gain amplifiers 29' and 30'. Once again, each of variable gain amplifiers 27',28',29' and 30' is arranged so that the gain thereof will be increased or decreased in response to a decrease or increase, respectively, in the detected frequency deviation of the respective FM audio signal $LF_1, LF_2, RF_3$ and $RF_4$, and hence in response to a decrease or increase, respectively, in the level of the audio signal SL or SR to be recorded.

In the recording apparatus 10' or 10" according to this invention, it is desirable that the level of each of the FM audio signals $LF_1, LF_2, RF_3$ and $RF_4$ be varied by a maximum of $\pm 2.5$ dB, that is, within a range of 5 dB, upon changes in the level of the respective audio signal to be recorded, as shown on FIG. 9. Furthermore, in the case of the recording appartus 10' or 10", the level of the frequency-converted chrominance signal C, as applied to adders 33 and 34, is desirably substantially smaller than the level of frequency-modulated luminance signal $L_m$, that is, the level of the signal C is again approximately $-10$ dB in respect to the level of the signal $L_m$. In view of the magnetic characteristic of the heads 46 and 47 and tape T shown on FIG. 7, the variable gain amplifiers 27',28',29' and 30', in the recording apparatus 10' or 10", are initially adjusted so that the FM audio signals $LF_1, LF_2, RF_3$ and $RF_4$, as applied to mixers 31 and 32, have successively increased values relative to each other, that is, $LF_1 < LF_2 < RF_3 < RF_4$, as shown on FIG. 9, with such FM audio signals substantially maintaining the described relationship while varying within the previously mentioned range of 5 dB. Finally, in each of recording apparatuses 10' and 10", the automatically adjusted variable gain amplifiers 27',28',29' and 30' are initially adjusted or designed so that the levels of FM audio signals $LF_1, LF_2, RF_3$ and $RF_4$, even when varied within the 5 dB range, are substantially within the range from about $-20$ dB to about $-30$ dB in respect to the level of the FM luminance signal $L_m$.

When the foregoing conditions are satisfied in recording apparatus 10' or 10", beat interference is substantially avoided between the FM audio signals and the frequency-converted chrominance signal C and the frequency-modulated luminance signal $L_m$ while ensuring that the several FM audio signals, with different carrier frequencies, are recorded at the same levels, as was previously described with reference to the recording apparatus 10 of FIG. 1. Moreover, in the case of the recording apparatus 10' or 10", the variation of the level of each of the FM audio signals $LF_1, LF_2, RF_3$ and $RF_4$ inversely upon a variation in the level of the respective audio signal SL or SR to be recorded ensures that a desirable S/N ratio is maintained for the FM audio signals when recorded with the composite color video signal in the slant tracks on the magnetic tape.

In each of FIGS. 1, 8 and 10, the present invention has been shown applied to an apparatus for recording left and right channel stereophonic sound signals SL and SR with a color video signal V in a video tape recorder or VTR. However, it will be appreciated that the invention can be similarly applied to the recording of a monaural audio signal with a color video signal in a VTR, in which case, for example, the monaural signal could be applied to the input terminal 11, while the input terminal 12 and the elements located in the corresponding circuit paths and identified by the reference numerals 18,19,20,21,22,25,26,29 and 30, or 29' and 30', are eliminated or inoperative. Thus, in recording a monaural audio signal, the mixed signal $M_1$ recorded by head 46 in each slant track $t_1$ would be comprised of the FM audio signal resulting from the modulation of the carrier in frequency modulator 16 by the monaural audio signal, combined or mixed with the composite color video signal formed by the frequency-converted chrominance signal C and the frequency-modulated luminance signal $L_m$, while the mixed signal $M_2$ recored in each slant track $t_2$ by head 47 would be comprised of the FM audio signal resulting from the modulation of the carrier in frequency modulator 17 by the monaural audio signal combined or mixed with the composite color video signal.

Furthermore, although the arrangement of the FM audio signals described above with reference to FIG. 2 is generally preferred, in a recording apparatus according to this invention, the carriers having the frequencies $f_1$ and $f_3$ may be frequency-modulated by the left channel signal SL to provide left FM signals $LF_1$ and $LF_3$, respectively, while the carriers having the frequencies $f_2$ and $f_4$ may be respectively frequency-modulated by the right channel signal SR so as to provide right FM signals $RF_2$ and $RF_4$. In such case, FM audio signals having frequency bands adjacent to each other are recorded in the same slant tracks on tape T. Thus, for example, left FM signal $LF_1$ and right FM signal $RF_2$ will be recorded in each slant track $t_1$, while left FM signal $LF_3$ and right FM signal $RF_4$ are recorded in each slant track $t_2$.

Having specifically described a number of embodiments of this invention with reference to the accompanying drawings, it is to be understood that the invention is not limited to those precise embodiments, and that various changes and modifications, among which several have been mentioned, may be effected therein by one skilled in the art without departing from the scope or spirit of the invention as defined in the appended claims.

What is claimed is:

1. Apparatus for recording color video and audio signals comprising:

frequency-modulating means for modulating a plurality of carriers having different frequencies by an audio signal to be recorded and thereby providing a corresponding plurality of respective FM audio signals;

video signal processing means receiving a color video signal which has luminance and chrominance components and including additional frequency-modulating means for modulating an additional carrier with said luminance component, said additional carrier having a frequency substantially higher than that of each of the carriers of said FM audio signals so that the resulting FM luminance signal is in a band of which at least the major part is above a band containing said FM audio signals, and frequency converting means for converting said chrominance component to a frequency converted chrominance signal in a relatively low frequency band spaced from said band of said FM luminance signal to provide a gap therebetween in which said FM audio signals are situated;

first mixing means for mixing said FM luminance signal and said frequency converted chrominance signal with one of said FM audio signals and thereby providing a first mixed audio and video signal;

second mixing means for mixing said FM luminance signal and said frequency converted chrominance signal with another of said FM audio signals and thereby providing a second mixed audio and video signal;

first and second magnetic heads respectively receiving said first and second mixed audio and video signals from said first and second mixing means for recording said first and second mixed signals in respective record tracks on a magnetic record medium, said heads and record medium having a magnetic characteristic which varies with the frequency of the signal being recorded; and the levels of said FM audio signals, in said first and second mixed signals, being substantially less than the levels of said FM luminance and frequency converted chrominance signals and said levels of the FM audio signals being different from each other in the sense to compensate for said magnetic characteristic which varies with frequency.

2. Apparatus according to claim 1; in which each of said FM audio signals having a carrier frequency higher than that of another of said FM audio signals is provided with a level higher than the level of said other FM audio signal.

3. Apparatus according to claim 1; further comprising means for individually determining said levels of the FM audio signals as applied to said first and second mixing means, respectively.

4. Apparatus according to claim 3; in which said means for individually determining said levels of the FM audio signals include a plurality of variable gain amplifiers through which said plurality of FM audio signals are respectively supplied to said first and second mixing means.

5. Apparatus according to claim 4; further comprising means controlling said variable gain amplifiers in accordance with the level of said audio signal prior to the modulation of said carriers by the latter.

6. Apparatus according to claim 4; further comprising means controlling said variable gain amplifiers in accordance with the frequency deviations of said FM audio signals which are respectively supplied therethrough to said first and second mixing means.

7. Apparatus according to claim 1; in which the first-mentioned frequency-modulating means modulates first and second carriers by the first-mentioned audio signal to be recorded to provide first and second of said FM audio signals, and further modulates third and fourth carriers by a second audio signal to be recorded to provide third and fourth FM audio signals, respectively, with all of said first, second, third and fourth carriers having different respective frequencies; and in which said first mixing means mixes, with said FM luminance signal and said frequency-converted chrominance signal, two of said FM audio signals which represent said first and second audio signals to be recorded, respectively, and thereby provides said first mixed audio and video signal, and said second mixing means mixes the remaining two of said FM audio signals with said FM luminance signal and said frequency-converted chrominance signal to provide said second mixed audio and video signal.

8. Apparatus according to claim 7; in which said respective frequencies of said first, second, third and fourth carriers have successively increased values, said two FM audio signals mixed with said FM luminance and frequency-converted chrominance signals in said first mixing means are said first and third FM audio signals, and said remaining two FM audio signals mixed with said FM luminance and frequency-converted chrominance signals in said second mixing means are said second and fourth FM audio signals.

9. Apparatus according to claim 8; in which said first and second audio signals to be recorded are stereophonic left and right signals, respectively.

10. Apparatus according to claim 1; in which said record tracks are parallely adjacent each other on the record medium and arranged without guard bands therebetween.

11. Apparatus according to claim 10; in which said record medium is a magnetic tape, and said first and second heads have different azimuth angles and are driven in a circular path to alternately scan across said tape while the latter is advanced longitudinally so that said first and second mixed signals are recorded in alternating record tracks which are skewed relative to said tape.

12. Apparatus according to claim 11; further comprising fixed magnetic head means disposed adjacent said magnetic tape and receiving said audio signal to be recorded in a respective longitudinal track along the tape.

13. Apparatus according to claim 1; in which said levels of said FM audio signals are in a range from about $-20$ dB to about $-30$ dB in respect to said level of said FM luminance signal.

14. Apparatus according to claim 13; in which said level of the frequency-converted chrominance signal is about $-10$ dB in respect to said level of the FM luminance signal.

15. Apparatus according to claim 14; in which each of said FM audio signals having a carrier frequency higher than that of another of said FM audio signals in provided with a level higher than the level of said other FM audio signal.

16. Apparatus according to claim 15; in which the first-mentioned frequency-modulating means modulates first and second carriers by the first-mentioned audio signal to be recorded to provide first and second of said FM audio signals in said range from about $-20$ dB to about $-30$ dB, and further modulates third and fourth carriers by a second audio signal to be recorded to provide third and fourth FM audio signals, respectively, also in said range from about $-20$ dB to about $-30$ dB, with all of said first, second, third and fourth carriers having different respective frequencies; and in which said first mixing means mixes, with said FM luminance signal and said frequency-converted chrominance signal, two of said FM audio signals which represent said first and second audio signals to be recorded, respectively, and thereby provides said first mixed audio and video signal, and said second mixing means mixes the remaining two of said FM audio signals with said FM luminance signal and said frequency-converted chrominance signal to provide said second mixed audio and video signal.

17. Apparatus according to claim 16; in which said respective frequencies of said first, second, third and fourth carriers have successively increased values, said two FM audio signals mixed with said FM luminance and frequency-converted chrominance signals in said first mixing means are said first and third FM audio signals, and said remaining two FM audio signals mixed with said FM luminance and frequency-converted chrominance signals in said second mixing means are said second and fourth FM audio signals.

18. Apparatus for recording color video and audio signals comprising:
frequency-modulating means for modulating a plurality of carriers having different frequencies by an audio signal to be recorded and thereby providing a corresponding plurality of respective FM audio signals;
video signal processing means receiving a color video signal which has luminance and chrominance components and including additional frequency-modulating means for modulating an additional carrier with said luminance component, said additional carrier having a frequency substantially higher than that of each of the carriers of said FM audio signals so that the resulting FM luminance signal is in a band of which at least the major part is above a band containing said FM audio signals, and frequency converting means for converting said chrominance component to a frequency converted chrominance signal in a relatively low frequency band spaced from said band of said FM luminance signal to provide a gap therebetween in which said FM audio signals are situated;
first mixing means for mixing said FM luminance signal and said frequency converted chrominance signal with one of said FM audio signals and thereby providing a first mixed audio and video signal;
second mixing means for mixing said FM luminance signal and said frequency converted chrominance signal with another of said FM audio signals and thereby providing a second mixed audio and video signal;
first and second magnetic heads respectively receiving said first and second mixed audio and video signals from said first and second mixing means for recording said first and second mixed signals in respective record tracks on a magnetic record medium;
means for varying the levels of said FM audio signals in said first and second mixed audio and video signals upon changes in the level of said audio signal to be recorded.

19. Apparatus according to claim 18; in which said means for varying said levels of the FM audio signals include a plurality of variable gain amplifiers through which said FM audio signals are respectively supplied to said first and second mixing means.

20. Apparatus according to claim 19; in which said variable gain amplifiers are controlled in accordance with the level of said audio signal prior to the modulation of said carriers by the latter.

21. Apparatus according to claim 19; further comprising means for detecting the frequency deviations of said FM audio signals which are supplied to said variable gain amplifiers; and in which said variable gain amplifiers are controlled in accordance with the detected frequency deviations of said FM audio signals respectively supplied thereto.

22. Apparatus according to claim 18; in which said heads and record medium have a magnetic characteristic which varies with the frequency of the signal being recorded, and said levels of said FM audio signals, as varied, are maintained in a predetermined relation to each other by which to compensate for said magnetic characteristic.

23. Apparatus according to claim 18; in which said levels of said FM audio signals are in the range from about $-20$ dB to about $-30$ dB in respect to said level of said FM luminance signal.

24. Apparatus according to claim 23; in which said level of the frequency-converted chrominance signal is about $-10$ dB in respect to said level of the FM luminance signal.

25. Apparatus according to claim 24; in which each of said levels of said FM audio signals is varied within a range of about 5 dB upon said changes in the level of the audio signal to be recorded.

26. Apparatus according to claim 18; in which each of said levels of said FM audio signals are varied within a range of about 5 dB upon said changes in the level of the audio signal to be recorded.

27. Apparatus according to claim 18; in which the first-mentioned frequency-modulating means modulates first and second carriers by the first-mentioned audio signal to be recorded to provide first and second of said FM audio signals, and further modulates third and fourth carriers by a second audio signal to be recorded to provide third and fourth FM audio signals, respectively, with all of said first, second, third and fourth carriers having different respective frequencies; and
in which said first mixing means mixes, with said FM luminance signal and said frequency-converted chrominance signal, two of said FM audio signals which represent said first and second audio signals to be recorded, respectively, and thereby provides said first mixed audio and video signal, and said second mixing means mixes the remaining two of said FM audio signals with said FM luminance signal and said frequency-converted chrominance signal to provide said second mixed audio and video signal.

28. Apparatus according to claim 27; in which said respective frequencies of said first, second, third and fourth carriers have successively increased values, said two FM audio signals mixed with said FM luminance and frequency-converted chrominance signals in said first mixing means are said first and third FM audio signals, and said remaining two FM audio signals mixed with said FM luminance and frequency-converted chrominance signals in said second mixing means are said second and fourth FM audio signals.

29. Apparatus accroding to claim 18; in which said audio signal to be recorded is one of left and right stereophonic sound signals, the first-mentioned frequency-modulating means modulates first and second of said plurality of carriers with said one stereophonic sound signal to respectively provide first and second of said FM audio signals, said first frequency-modulating means also modulates third and fourth carriers by the other of said stereophonic sound signals to respectively provide third and fourth FM audio signals, said first, second, third and fourth carriers have successively increased frequencies, and said first, second, third and fourth FM audio signals having successively increased levels substantially in a range from about $-20$ dB to about $-30$ dB in respect to said level of said FM luminance signal; and
in which said first mixing means mixes said first and third FM audio signals with said FM luminance and frequency-converted chrominance signals to provide said first mixed audio and video signal, and said second mixing means mixes said second and fourth FM audio signals with said FM luminance and frequency-converted chrominance signals to provide said second mixed audio and video signal.

30. Apparatus according to claim 29; in which said level of the frequency-converted chrominance signal is about −10 dB in respect to said level of the FM luminance signal.

31. Apparatus according to claim 30; in which the level of each of said FM audio signals is varied within a range of about 5 dB.

32. Apparatus according to claim 31; in which said record medium is a magnetic tape, and said first and second heads have different azimuth angles and are driven in a circular path to alternately scan across said tape while the latter is advanced longitudinally at a predetermined speed selected so that said first and second mixed signals are recorded in alternating parallel record tracks which are skewed relative to said tape and arranged without guard bands therebetween.

* * * * *